United States Patent
Hsu et al.

(10) Patent No.: US 6,798,687 B2
(45) Date of Patent: Sep. 28, 2004

(54) SYSTEM AND METHOD FOR EFFECTIVELY IMPLEMENTING A HIGH SPEED DRAM DEVICE

(75) Inventors: Kuoyuan Hsu, San Jose, CA (US); Gary Chang, Saragota, CA (US); Patrick Chuang, Cupertino, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 102 days.

(21) Appl. No.: 10/320,056

(22) Filed: Dec. 16, 2002

(65) Prior Publication Data

US 2004/0114420 A1 Jun. 17, 2004

(51) Int. Cl.⁷ .................................................. G11C 7/00
(52) U.S. Cl. ................................... 365/149; 365/204
(58) Field of Search ................................. 365/149, 203, 365/204, 185.25

(56) References Cited

U.S. PATENT DOCUMENTS 6,594,188 B2 * 7/2003 Hottgenroth ................ 365/203
6,614,679 B2 * 9/2003 Shirahama .................. 365/149
6,625,064 B1 * 9/2003 Morgan et al. ........ 365/189.01

* cited by examiner

*Primary Examiner*—Tan T. Nguyen
(74) *Attorney, Agent, or Firm*—Gregory J. Koerner; Simon & Koerner LLP

(57) ABSTRACT

A system and method for effectively implementing a high-speed DRAM device may include memory cells that each have a bitline for transferring storage data, a wordline for enabling an accelerated-write operation in the memory cell, and a data storage node with a corresponding cell voltage. An accelerated-write circuit may then directly provide the storage data to an appropriate bitline in a pre-toggled state in response to one or more accelerated-write enable signals. The corresponding cell voltage may therefore begin a state-change transition towards the pre-toggled state immediately after the wordline is activated to successfully reach a full-state level before the wordline is deactivated during a high-speed memory cycle.

41 Claims, 7 Drawing Sheets

SYSTEM AND METHOD FOR EFFECTIVELY IMPLEMENTING A HIGH SPEED DRAM DEVICE

BACKGROUND SECTION

1. Field of the Invention

This invention relates generally to techniques for implementing memory systems, and relates more particularly to a system and method for effectively implementing a high-speed DRAM device.

2. Description of the Background Art

Implementing effective methods for implementing memory systems is a significant consideration for designers and manufacturers of contemporary electronic entertainment systems. However, effectively implementing memory systems may create substantial challenges for system designers. For example, enhanced demands for increased system functionality and performance may require more system memory and require additional hardware resources. An increase in memory or related hardware requirements may also result in a corresponding detrimental economic impact due to increased production costs and operational inefficiencies.

Furthermore, enhanced system capability to perform various advanced operations may provide additional benefits to a system user, but may also place increased demands on the control and management of system memory devices. For example, an enhanced electronic system that effectively supports interactive television may benefit from an efficient memory implementation because of the large amount and complexity of the digital data involved.

Due to growing demands on system resources and substantially increasing data magnitudes, it is apparent that developing new techniques for implementing and utilizing memory systems is a matter of concern for related electronic technologies. Therefore, for all the foregoing reasons, developing effective systems for implementing and utilizing memory devices remains a significant consideration for designers, manufacturers, and users of contemporary electronic systems.

SUMMARY

In accordance with the present invention, a system and method are disclosed for effectively implementing a high-speed DRAM device for performing various accelerated-write operations. In accordance with one embodiment of the present invention, initially, a DRAM controller or other appropriate entity may activate a wordline corresponding to a DRAM cell in the DRAM device to thereby initiate a corresponding accelerated-write operation.

Immediately after the foregoing wordline is turned on, in accordance with the present invention, bitline voltage levels for a bitline and a corresponding bitline bar may begin to diverge in opposite directions in an accelerated bitline split/amplification procedure. In addition, the bitline and bitline bar may preferably begin to diverge towards pre-toggled states that correspond to final state levels of the accelerated-write operation.

In response to the foregoing change in bitline voltage levels, a cell voltage level representing a stored data value in the DRAM cell may immediately start to charge or discharge, depending upon whether the accelerated-write operation is a low-to-high transition (charge) or a high-to-low transition (discharge). Then, a sense amplifier may be enabled for amplifying the bitline voltage levels to reach their respective bitline full-state levels.

Next, in accordance with the present invention, the foregoing cell voltage level of the DRAM cell may advantageously reach a cell voltage full-state level before termination of the high-speed memory cycle. The DRAM controller or other entity may subsequently de-activate the wordline to the DRAM cell to store the corresponding write-data value. Finally, a sense amplifier or other appropriate entity may equalize the bitline voltage levels for the bitline and the bitline bar to prepare the DRAM cell for another high-speed memory access cycle. The present invention thus provides an effective system and methodology for implementing a high-speed DRAM device that performs an accelerated-write operation.

DETAILED DESCRIPTION

The present invention relates to an improvement in memory systems. The following description is presented to enable one of ordinary skill in the art to make and use the invention, and is provided in the context of a patent application and its requirements. Various modifications to the disclosed embodiments will be readily apparent to those skilled in the art, and the generic principles herein may be applied to other embodiments. Thus, the present invention is not intended to be limited to the embodiments shown, but is to be accorded the widest scope consistent with the principles and features described herein.

The present invention is described herein as a system and method for effectively implementing a high-speed DRAM device that may include memory cells which each have a bitline for transferring storage data, a wordline for enabling an accelerated-write operation in the memory cell, and a data storage node with a corresponding cell voltage. An accelerated-write circuit may then directly provide the storage data to an appropriate bitline in a pre-toggled state in response to one or more accelerated-write enable signals. The corresponding cell voltage may therefore begin a state-change transition towards the pre-toggled state immediately after the wordline is activated to successfully reach a full-state level before the wordline is deactivated during a high-speed memory cycle.

Figure 1:
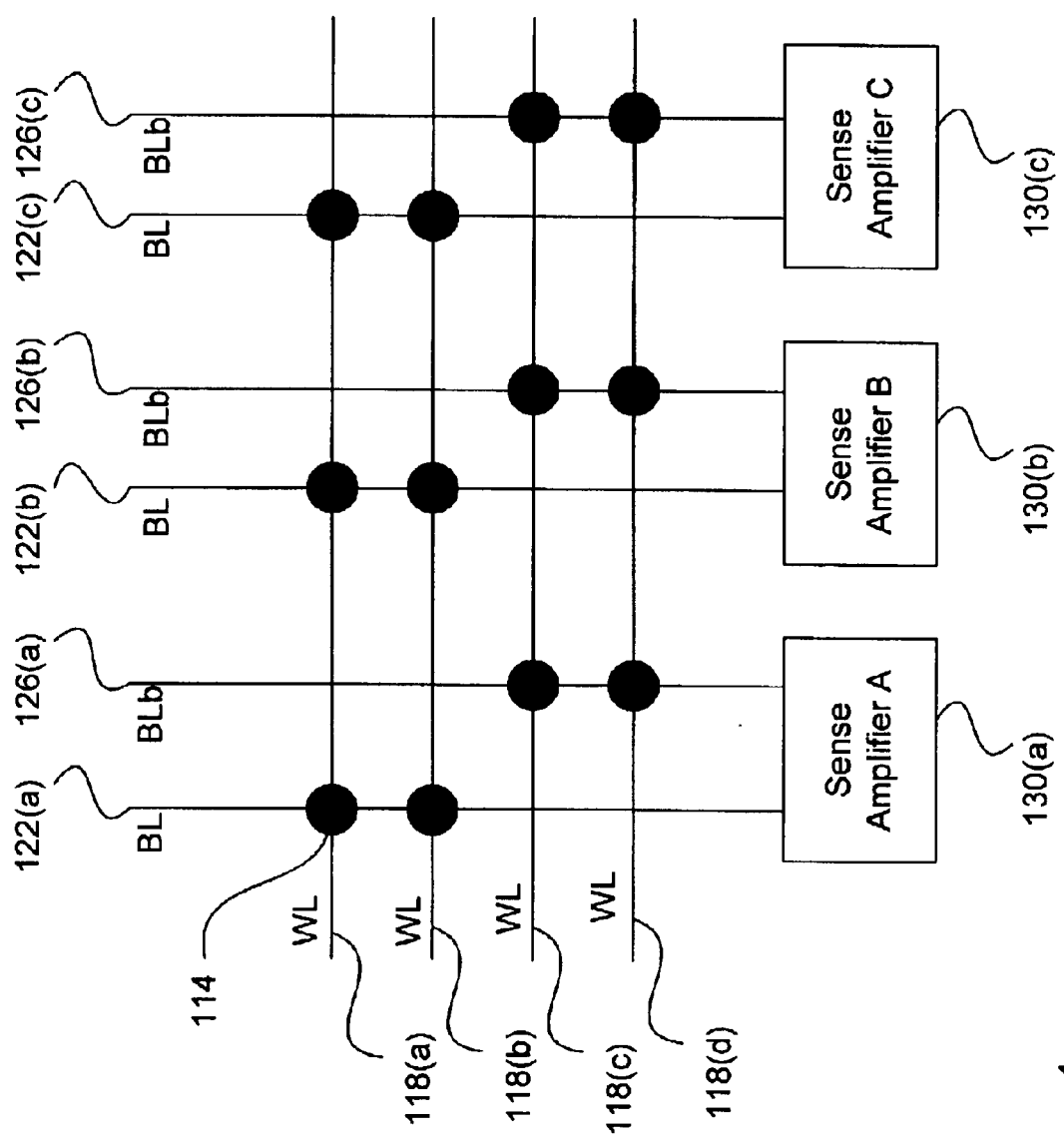
FIG. 1 is a schematic diagram of a high-speed DRAM device, in accordance with one embodiment of the present invention.

Referring now to FIG. 1, a schematic diagram of a high-speed dynamic random access memory (DRAM) device 110 is shown, in accordance with one embodiment of the present invention. The FIG. 1 embodiment is presented for purposes of illustration, and in alternate embodiments, DRAM device 110 may readily be implemented using various components and configurations in addition to, or instead of, those discussed in conjunction with the FIG. 1 embodiment. For example, DRAM device 110 may be implemented with any desired number of DRAM cells, wordlines, bitlines, or sense amplifiers that are arranged in any appropriate configuration.

In the FIG. 1 embodiment, DRAM device 110 may include a series of DRAM cells that each store an individual digital bit value. In the FIG. 1 embodiment, the foregoing DRAM cells are each represented by a black dot (such as exemplary DRAM cell 114) that are each positioned at a different intersection of a given wordline (WL) 118 and a corresponding bitline (BL) 122 or a corresponding bitline bar (BLb) 126. For example, in the FIG. 1 embodiment, DRAM cell 114 is shown connected to wordline 118(a) and bitline 122(a).

In the FIG. 1 embodiment, each bitline 122 is associated with a corresponding bitline bar 126 which is the logical compliment of that associated bitline 122. For example, bitline 122(a) is associated with bitline bar 126(a), bitline 122(b) is associated with bitline bar 126(b), and bitline 122(c) is associated with bitline bar 126(c). In the FIG. 1 embodiment, each of the foregoing bitline pairs are coupled to a corresponding sense amplifier 130. For example, bitline 122(a) and bitline bar 126(a) are coupled to sense amplifier A 130(a), bitline 122(b) and bitline bar 126(b) are coupled to sense amplifier B 130(b), and bitline 122(c) and bitline bar 126(c) are coupled to sense amplifier B 130(c). The functionality and operation of DRAM cell 114 is further discussed below in conjunction with FIGS. 2–6.

Figure 2:
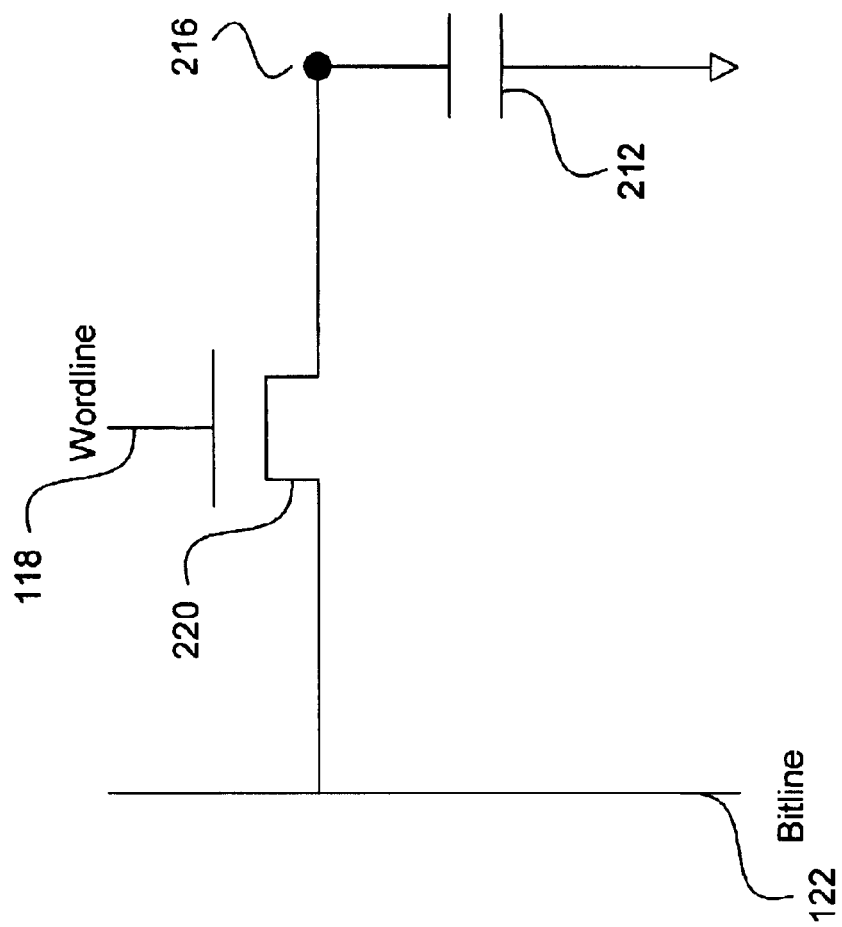
FIG. 2 is a block diagram for one embodiment of a DRAM cell in a high-speed DRAM device, in accordance with the present invention.

Referring now to FIG. 2, a block diagram for one embodiment of a DRAM cell 114 is shown, in accordance with the present invention. The FIG. 2 embodiment is presented for purposes of illustration, and in alternate embodiments, DRAM cell 114 may readily be implemented using various components and configurations in addition to, or instead of, those discussed in conjunction with the FIG. 2 embodiment. For example, the DRAM cell 114 of FIG. 2 is presented in an NMOS implementation, however, in various other embodiments, the present invention may readily be implemented in a corresponding PMOS configuration.

In the FIG. 2 embodiment, a cell capacitor 212 may preferably store a DRAM cell voltage 216 that represents a current stored digital bit value in DRAM device 110. A field-effect transistor (FET) 220 may be controlled by a wordline 118 (see FIG. 1) to isolate the DRAM cell voltage 216 when wordline 118 is turned off, and to connect DRAM cell voltage 216 to bitline 122 when wordline 118 is turned on. DRAM device 110 may thus write or read digital bit values to or from DRAM cell 114 by activating a corresponding wordline 118.

However, FET 220 typically exhibits relatively high resistance characteristics, even when wordline 118 is turned on to permit electrical current to flow between cell capacitor 212 and bitline 122. Therefore, DRAM cell voltage 216 requires a finite time period for charging or discharging to a full-state level after wordline 118 is turned on. The operation and functionality of DRAM cell 114 is further discussed below in conjunction with FIGS. 3–6.

Figure 3:
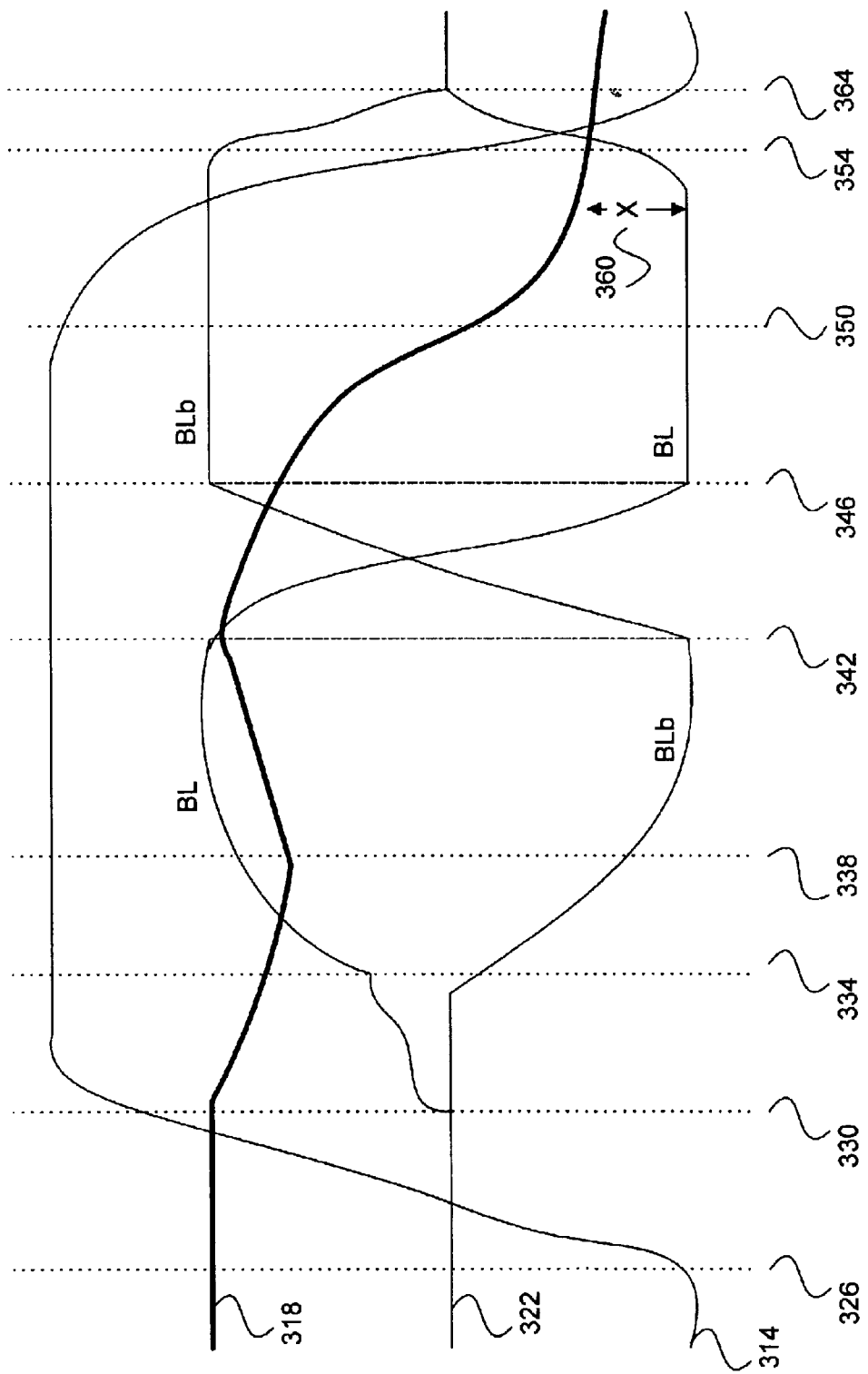
FIG. 3 is a timing diagram illustrating timing relationships during a write cycle of a DRAM device.

Referring now to FIG. 3, a timing diagram 310 illustrating timing relationships during a write cycle of a DRAM device is shown. Timing diagram 310 depicts time on a horizontal axis and depicts voltage on a vertical axis. In the FIG. 3 embodiment, a wordline waveform 314 corresponding to wordline 118 (FIG. 2), and a DRAM cell voltage waveform 318 corresponding to DRAM cell voltage 216 (FIG. 2) are shown. Also shown is a bitline waveform 322 that includes waveforms for bitline (BL) 122 (FIG. 2) and bitline bar (BLb) 126 (FIG. 1).

In alternate embodiments, the present invention may readily be performed using various techniques, sequences, and timing relationships in addition to, or instead of, those discussed in conjunction with the FIG. 3 embodiment. For example, timing diagram 310 depicts a write cycle that replaces a digital "high" value in DRAM cell 114 with a digital "low" value. Furthermore, bitlines 122 and 126 are shown as being precharged to a medium voltage level. However, in alternate embodiments, the present invention may readily be utilized to perform "low-to-high" write operations, and may also utilize bitlines that are precharged to either a low level or a high level.

In the FIG. 3 embodiment, approximately at time 326, wordline 118 is turned on and wordline waveform 314 begins to rise. Then, approximately at time 330, bitline waveform 322 splits into a positive-going bitline waveform corresponding to bitline (BL) 122 and a negative bitline bar waveform corresponding to bitline bar (BLb) 126. Simultaneously, at approximate time 330, DRAM cell voltage waveform 318 begins to discharge because of the connection to bitline 122.

At approximate time 334, a sense amplifier 130 begins to amplify the positive-going bitline waveform and the negative going bitline bar waveform. Then, at approximate time 338, as bitline waveform 322 is amplified by sense amplifier 130, DRAM cell voltage 318 begins to responsively rise. Then, between approximate time 342 and approximate time 346, a column select pulse triggers a write operation in DRAM cell 114 during which the bitline waveform for bitline 122 toggles from a high value at approximate time 342 to a low value at time 346. Concurrently, the bitline bar waveform for bitline bar 126 toggles from a low value at approximate time 342 to a high value at approximate time 346.

Approximately at time 342, as the bitline waveform for bitline 122 begins to toggle from a high value to a low value, the corresponding DRAM cell voltage waveform 318 for DRAM cell voltage 216 begins to also discharge. However, as discussed above in conjunction with FIG. 2, because of the finite time period required to discharge cell capacitor 212 through FET 220 in DRAM cell 114, DRAM cell voltage waveform 318 fails to reach a full "low" state level by the time wordline waveform 314 is turned off at time 350. For example, at approximate time 354, DRAM cell voltage waveform 318 is shown to be an approximate value "X" 360 away from reaching a full low state level. Furthermore, because wordline 118 has been turned off, further discharging of DRAM cell voltage 216 is not possible.

The foregoing problem is further compounded by efforts to allow DRAM device 110 and DRAM cell 114 to perform in various high-speed operation modes, because, as DRAM cycle times are decreased to provide faster DRAM access characteristics, the DRAM voltage level 216 becomes even more unsatisfactory. In certain embodiments, DRAM cell 114 may preferably support read and/or write cycles of less than 8 nanoseconds. In the FIG. 3 embodiment, finally, at approximate time 364, bitline waveform 322 is equalized to return both bitline 122 and bitline bar 126 to a middle level so that another DRAM cycle may then occur.

Figure 4A:
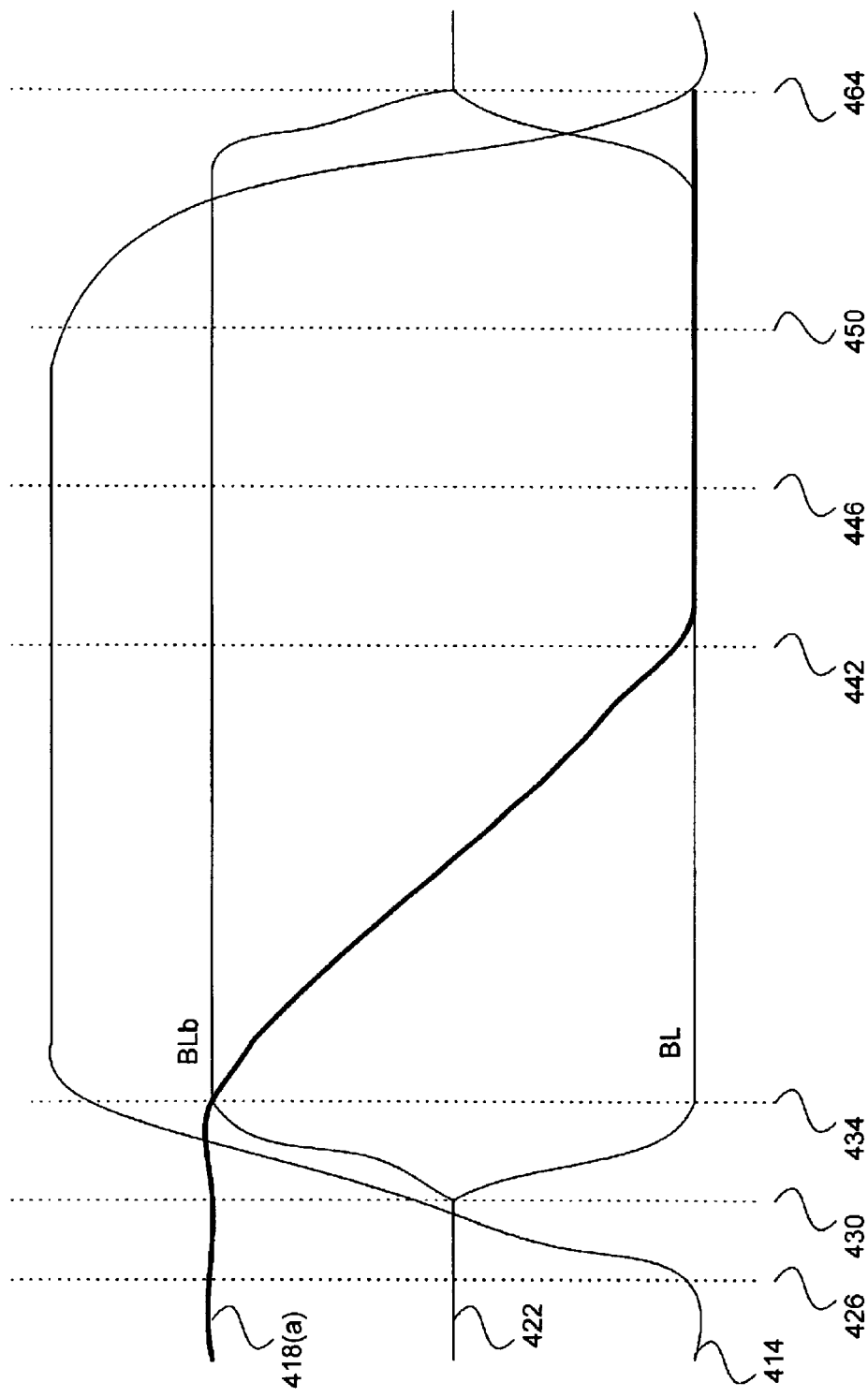
FIG. 4A is a timing diagram illustrating timing relationships during an accelerated high-to-low write cycle of a high-speed DRAM device, in accordance with one embodiment of the present invention.

Referring now to FIG. 4A, a timing diagram 410(a) illustrating timing relationships during an accelerated high-to-low write cycle of a high-speed DRAM device 110 is shown, in accordance with one embodiment of the present invention. Timing diagram 410(a) depicts time on a horizontal axis and depicts voltage on a vertical axis. In the FIG. 4A embodiment, a wordline waveform 414 corresponding to wordline 118 (FIG. 2), and a DRAM cell voltage waveform 418(a) corresponding to DRAM cell voltage 216 (FIG. 2) are shown. Also shown is a bitline waveform 422 that includes waveforms for bitline (BL) 122 (FIG. 2) and bitline bar (BLb) 126 (FIG. 1).

In alternate embodiments, the present invention may readily be perform accelerated write cycles by using various techniques, sequences, and timing relationships in addition to, or instead of, those discussed in conjunction with the FIG. 4A embodiment. For example, timing diagram 410(*a*) depicts an accelerated "high-to-low" write cycle that replaces a digital "high" value in DRAM cell 114 with a digital "low" value. Furthermore, bitlines 122 and 126 are shown as being precharged to a medium voltage level. However, as one skilled in the art will appreciate, the present invention may readily be utilized to perform "low-to-high" accelerated write operations, and may also utilize bitlines that are precharged to either a low level or a high level.

In the FIG. 4A embodiment, at approximate time 426, wordline 118 is turned on and wordline waveform 414 begins to rise. In accordance with the present invention, immediately or very shortly after wordline 118 is turned on, DRAM device 110 performs an accelerated bitline split/amplification procedure. In the FIG. 4A embodiment, at approximate time 430, waveform 422 rapidly splits into a negative-going bitline waveform corresponding to bitline (BL) 122 and a positive-going bitline bar waveform corresponding to bitline bar (BLb) 126. However, unlike the FIG. 3 embodiment, DRAM device 110 performs the FIG. 4A accelerated bitline split/amplification procedure by utilizing pre-toggled bitlines from the very start of the accelerated bitline split/amplification procedure.

In accordance with the present invention, concurrently or very shortly after bitline waveform 422 splits into the bitline waveform and the bitline bar waveform, DRAM cell voltage waveform 418(*a*) begins an accelerated state-level transition procedure. In the FIG. 4A embodiment, at approximate time 434, DRAM cell voltage waveform 418(*a*) begins to discharge because of current flowing between bitline 122 and cell capacitor 212 (FIG. 2).

In accordance with the present invention, by approximate time 442 (which corresponds to the write-operation column select pulse of FIG. 3), DRAM cell voltage waveform 418(*a*) has advantageously reached a full "low" state level, which is well in advance of when wordline waveform 414 is turned off at approximate time 450. In the FIG. 4A embodiment, finally, at approximate time 464, bitline waveform 422 is equalized to return both bitline 122 and bitline bar 126 to a middle level so that another DRAM cycle may then occur.

The present invention therefore allows DRAM device 110 and DRAM cell 114 to perform in various high-speed operation modes, because, even as DRAM cycle times are decreased to provide faster DRAM access characteristics, DRAM voltage level 216 still has sufficient time to reach a full state level due to the foregoing accelerated write operation.

Figure 4B:
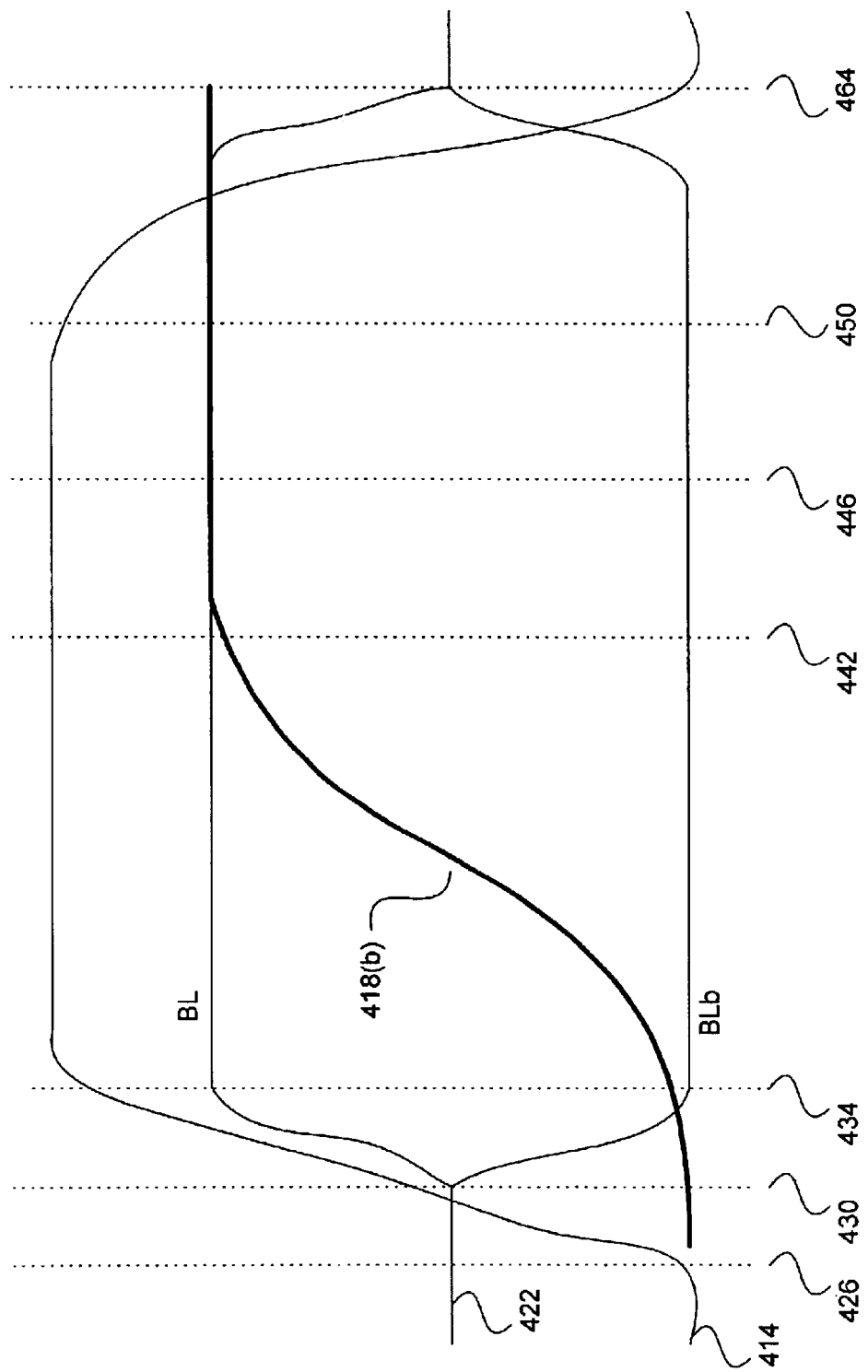
FIG. 4B is a timing diagram illustrating timing relationships during an accelerated low-to-high write cycle of a high-speed DRAM device, in accordance with one embodiment of the present invention.

Referring now to FIG. 4B, a timing diagram 410(*b*) illustrating timing relationships during an accelerated low-to-high write cycle of a high-speed DRAM device 110 is shown, in accordance with one embodiment of the present invention. Timing diagram 410(*b*) depicts time on a horizontal axis and depicts voltage on a vertical axis. In the FIG. 4B embodiment, a wordline waveform 414 corresponding to wordline 118 (FIG. 2), and a DRAM cell voltage waveform 418(*b*) corresponding to DRAM cell voltage 216 (FIG. 2) are shown. Also shown is a bitline waveform 422 that includes waveforms for bitline (BL) 122 (FIG. 2) and bitline bar (BLb) 126 (FIG. 1).

In alternate embodiments, the present invention may readily be perform accelerated write cycles by using various techniques, sequences, and timing relationships in addition to, or instead of, those discussed in conjunction with the FIG. 4B embodiment. For example, timing diagram 410(*b*) depicts an accelerated "low-to-high" write cycle that replaces a digital "low" value in DRAM cell 114 with a digital "high" value. Furthermore, bitlines 122 and 126 are shown as being precharged to a medium voltage level. However, as one skilled in the art will appreciate, the present invention may readily be utilized to perform "high-to-low" accelerated write operations, and may also utilize bitlines that are precharged to either a low level or a high level.

In the FIG. 4B embodiment, at approximate time 426, wordline 118 is turned on and wordline waveform 414 begins to rise. In accordance with the present invention, immediately or very shortly after wordline 118 is turned on, DRAM device 110 performs an accelerated bitline split/amplification procedure. In the FIG. 4B embodiment, at approximate time 430, waveform 422 rapidly splits into a positive-going bitline waveform corresponding to bitline (BL) 122 and a negative-going bitline bar waveform corresponding to bitline bar (BLb) 126. However, unlike the FIG. 3 embodiment, DRAM device 110 performs the FIG. 4B accelerated bitline split/amplification procedure by utilizing pre-toggled bitlines from the very start of the accelerated bitline split/amplification procedure.

In accordance with the present invention, concurrently or very shortly after bitline waveform 422 splits into the bitline waveform and the bitline bar waveform, DRAM cell voltage waveform 418(*b*) begins an accelerated state-level transition procedure. In the FIG. 4B embodiment, at approximate time 434, DRAM cell voltage waveform 418(*b*) begins to charge because of current flowing between bitline 122 and cell capacitor 212 (FIG. 2).

In accordance with the present invention, by approximate time 442 (which corresponds to the write-operation column select pulse of FIG. 3), DRAM cell voltage waveform 418(*b*) has advantageously reached a full "high" state level, which is well in advance of when wordline waveform 414 is turned off at approximate time 450. In the FIG. 4B embodiment, finally, at approximate time 464, bitline waveform 422 is equalized to return both bitline 122 and bitline bar 126 to a middle level so that another DRAM cycle may then occur.

The present invention therefore allows DRAM device 110 and DRAM cell 114 to perform in various high-speed operation modes, because, even as DRAM cycle times are decreased to provide faster DRAM access characteristics, DRAM voltage level 216 still has sufficient time to reach a full state level due to the foregoing accelerated write operation.

Figure 5:
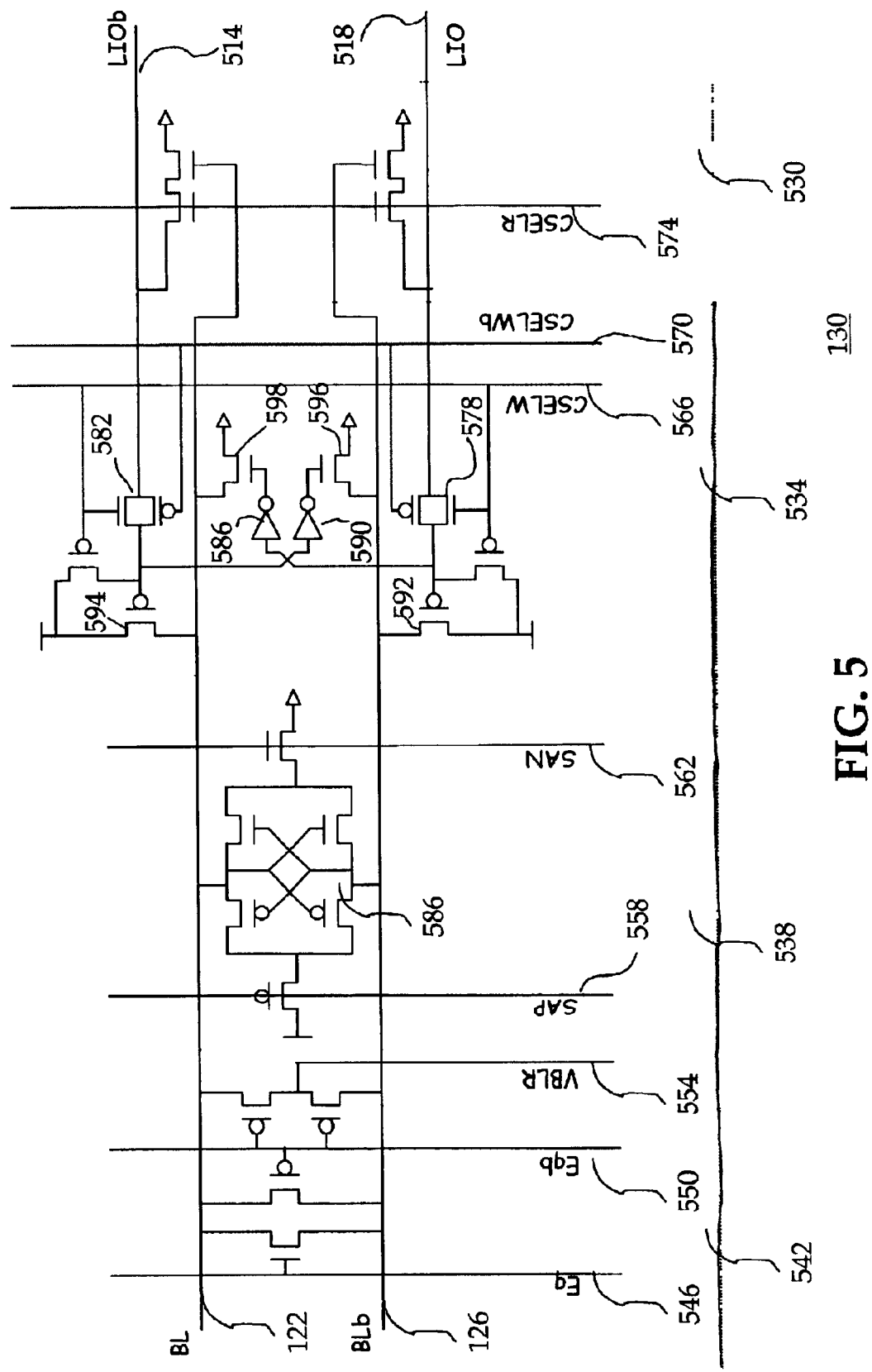
FIG. 5 is a schematic diagram for an accelerated-write sense amplifier, in accordance with one embodiment of the present invention.

Referring now to FIG. 5, a schematic diagram for an accelerated-write sense amplifier 130 is shown, in accordance with one embodiment of the present invention. In alternate embodiments, accelerated-write sense amplifier 130 may readily be implemented using various components, circuits/sections, and configurations in addition to, or instead of, those discussed in conjunction with the FIG. 5 embodiment.

In the FIG. 5 embodiment, accelerated-write sense amplifier 130 may include, but is not limited to, a non-disturb read section 530, an accelerated-write section 534, a sense amplification section 538, and a bitline equalization section 542. In addition, accelerated-write sense amplifier 130 may include a bitline (BL) 122 and a bitline bar (BLb) 126 that transfer complementary data values to (write operation) and from (read operation) corresponding DRAM cells 114 in DRAM device 110 (see FIGS. 1 and 2). Furthermore, accelerated-write sense amplifier 130 may include a local input-output line (LIO) 518 and a local input-output bar line (LIOb) 514 that transfer data values to a data destination (read operation) and from a data source (write operation).

In the FIG. 5 embodiment, a DRAM controller (not shown) or other appropriate entity may provide a CSELR signal 574 to non-disturb read section 530 to thereby enable non-disturb read section 530 to read data values directly from BL 122 and BLb 126 onto LIOb 514 and LIO 518. Similarly, the DRAM controller or other appropriate entity may provide an SAP signal 558 and an SAN signal 562 for activating a sense amplifier circuit 586 in sense amplification section 538. In addition, the DRAM controller or other appropriate entity may provide an Eq signal 546 and an Eqb signal 550 to equalization section 542 to connect BL 122 and BLb 126 and thereby cause their respective values to equalize.

In accordance with the present invention, in the FIG. 5 embodiment, the DRAM controller or other appropriate entity may provide a CSELW signal 566 and a CSELWb signal 570 to accelerated-write section 534 to thereby enable an accelerated write operation. The accelerated-write section 534 then performs a direct bitline-data transfer procedure to immediately transfer certain data values present on LIO 518 and LIOb 514 directly onto BL 122 and BLb 126 (and therefore on to corresponding DRAM cells 114).

In practice, when the accelerated-write enable signals (CSELW signal 566 and CSELWb signal 570) are activated, the accelerated write-enable signals then turn on switch device 578 and switch device 582 to pass appropriate data values from LIO 518 and LIOb 514 onto BL 122 and BLb 126. In certain embodiments, LIO 518 and LIOb 514 may be held in a "high" state to disable accelerated-write operations.

However, when LIO 518 is pulled low with LIOb 514 remaining high, and CSELW signal 566 and CSELWb signal 570 are active, then the low value from LIO 518 may be passed to FET device 592 through switch device 578. In response, FET device 592 may pull BLb 126 to a high value. In addition, the low value from LIO 518 may be inverted and passed to FET device 598 through inverter 586. In response, FET device 592 may pull BL 122 to a low value.

Conversely, when LIOb 514 is pulled low with LIO 518 remaining high, and CSELW signal 566 and CSELWb signal 570 are active, then the low value from LIOb 514 may be passed to FET device 594 through switch device 582. In response, FET device 594 may pull BL 122 to a high value. In addition, the low value from LIOb 514 may be inverted and passed to FET device 596 through inverter 590. In response, FET device 596 may pull BLb 126 to a low value.

The accelerated-write circuit 534 of the FIG. 5 embodiment therefore effectively performs the foregoing direct bitline-data transfer procedure. However, in certain embodiments, various accelerated-write operations may readily be enabled or facilitated by utilizing appropriate means other than accelerated-write sense amplifier 130 to achieve the same or similar results.

Figure 6:
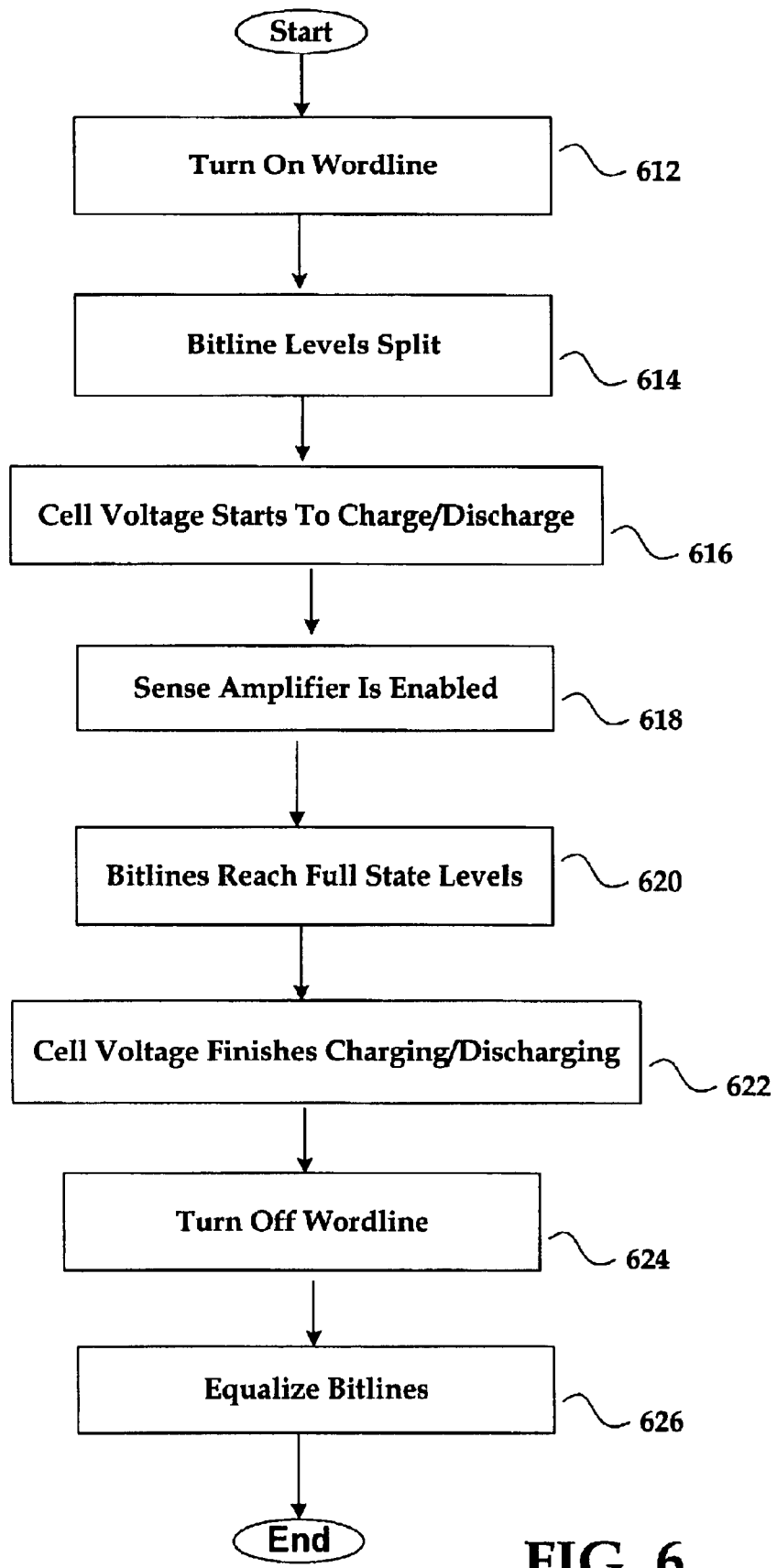
FIG. 6 is a flowchart of method steps for effectively implementing an accelerated write operation in a high-speed DRAM device, in accordance with one embodiment of the present invention.

Referring now to FIG. 6, a flowchart of method steps for effectively implemented an accelerated write operation in a high-speed DRAM device is shown, in accordance with one embodiment of the present invention. The FIG. 6 example is presented for purposes of illustration, and in alternate embodiments, the present invention may readily utilize various steps and sequences other than those discussed in conjunction with the FIG. 6 embodiment.

In the FIG. 6 embodiment, in step 612, a DRAM controller or other entity may initially turn on or activate a wordline 118 corresponding to a DRAM cell 114. Then, in step 614, immediately after the wordline 118 is turned on, bitline voltage levels for a bitline (BL) 122 and a corresponding bitline bar (BLb) 126 may begin to split or diverge in opposite directions.

In step 616, in response to the foregoing change in bitline voltage levels, a cell voltage level 216 representing a stored data value in DRAM cell 114 may immediately start to charge or discharge, depending upon whether the accelerated-write operation is a low-to-high transition (charge) or a high-to-low transition (discharge). Then, in step 618, a sense amplifier 130 may be enabled to amplify the bitline voltage levels for bitline (BL) 122 and corresponding bitline bar (BLb) 126. In step 620, the bitline voltage levels for bitline (BL) 122 and bitline bar (BLb) 126 reach their full-state levels.

In step 622, cell voltage level 216 advantageously reaches its full-state level, and finished charging or discharging. Then, in step 624, the a DRAM controller or other entity may turn off or de-activate the wordline 118 to DRAM cell 114 to thereby store the corresponding write-data value. Finally, in step 626, sense amplifier 130 or other appropriate entity may equalize the bitline voltage levels for BL 122 and BLb 126 to prepare DRAM cell 114 for another high-speed memory cycle. The FIG. 6 process may then terminate. The present invention thus provides an system and method for effectively implementing a high-speed DRAM device that performs various accelerated-write operations.

The invention has been explained above with reference to certain embodiments. Other embodiments will be apparent to those skilled in the art in light of this disclosure. For example, the present invention may readily be implemented using configurations and techniques other than those described in the embodiments above. Additionally, the present invention may effectively be used in conjunction with systems other than those described above. Therefore, these and other variations upon the discussed embodiments are intended to be covered by the present invention, which is limited only by the appended claims.

What is claimed is:

1. A system for implementing a high-speed memory device, comprising:
   a memory cell including a bitline for transferring storage data, a wordline for enabling an accelerated-write operation in said memory cell, and a data storage node having a cell voltage; and
   an accelerated-write circuit for directly providing said storage data to said bitline in a pre-toggled state in response to one or more accelerated-write enable signals, said cell voltage beginning a state-change transition towards said pre-toggled state immediately after said wordline is activated, said cell voltage reaching a full-state level before said wordline is deactivated during a high-speed memory cycle.

2. The system of claim 1 wherein said high-speed memory device is implemented to include a high-speed dynamic random-access memory device configured to perform said accelerated-write operation.

3. The system of claim 2 wherein said high-speed memory cycle of said high-speed dynamic random-access memory device is less than an approximate 8-nanosecond cycle duration time.

4. The system of claim 2 wherein said high-speed dynamic random-access memory device includes a plurality of DRAM cells, a series of bitline signals and corresponding bitline bar signals, a series of wordlines, and a series of accelerated-write sense amplifiers, each of said plurality of DRAM cells being coupled to one of said series of wordlines, each of said plurality of DRAM cells being coupled to either one of said series of bitline signals or one of said series of bitline bar signals, each of said series of accelerated-write sense amplifiers being coupled to a bitline pair that includes one of said series of bitline signals and a corresponding one of said series of bitline bar signals.

5. The system of claim 1 wherein said memory cell is implemented to include a cell capacitor device configured to store said cell voltage, and an FET device controlled by said wordline, said FET device coupling said cell capacitor to said bitline when said wordline is activated, said FET device decoupling said cell capacitor from said bitline when said wordline is deactivated, said FET device having relatively high resistance characteristics that cause said state-change transition to require a finite transition time to complete, said finite transition time limiting cycle time reductions in said high-speed memory cycle.

6. The system of claim 1 wherein said accelerated-write circuit is implemented as part of an accelerated-write sense amplifier that also includes a non-disturb read section for performing a non-disturb read operation to read data directly from said bitline to an output section of said high-speed memory device, a sense amplification section configured to perform a differential amplification procedure upon said bitline and a corresponding bitline bar signal, and an equalization section configured to perform a bitline equalization procedure to equalize voltage levels between said bitline and said bitline bar signal.

7. The system of claim 1 wherein a DRAM controller provides said one or more accelerated-write enable signals to said accelerated-write circuit to thereby enable said accelerated-write operation, said accelerated-write circuit then performing a direct bitline-data transfer procedure to immediately transfer data values present on an LIO line or an LIOb line into said memory device directly onto said bitline and a corresponding bitline bar.

8. The system of claim 7 wherein said accelerated-write enable signals include a CSELW signal and a CSELWb signal, said accelerated write-enable signals turning on a bitline bar switch device and bitline switch device to pass said data values from said LIO line and said LIOb line onto said bitline and said bitline bar.

9. The system of claim 8 wherein, when said LIO line is in a low state with said LIOb line remaining high, and said CSELW signal and said CSELWb signal are active, then an input low value from said LIO line is passed to a bitline bar FET device through said bitline bar switch device, said bitline bar FET device responsively pulling said bitline bar to a output high value, said input low value from said LIO line also being inverted and passed to a bitline FET device through a bitline inverter, said bitline FET device then pulling said bitline to a output low value.

10. The system of claim 8 wherein, when said LIOb line is in a low state with said LIO line remaining high, and said CSELW signal and said CSELWb signal are active, then an input low value from said LIOb line is passed to a bitline FET device through said bitline switch device, said bitline FET device responsively pulling said bitline to a high value, said input low value from said LIOb line also being inverted and passed to a bitline bar FET device through an inverter, said bitline bar FET device then pulling said bitline bar to a low output value.

11. The system of claim 1 wherein a DRAM controller activates a wordline of said memory cell to thereby couple said bitline to said cell voltage in said data storage node for initiating said accelerated-write operation.

12. The system of claim 11 wherein an accelerated bitline split/amplification procedure causes said bitline voltage levels for said bitline and a corresponding bitline bar to begin to diverge in opposite directions immediately after said wordline is activated.

13. The system of claim 12 wherein said bitline and said bitline bar begin to diverge towards pre-toggled states that correspond to final state levels of said accelerated-write operation.

14. The system of claim 13 wherein said cell voltage beings said state-change transition immediately after said accelerated bitline split/amplification procedure starts, said cell voltage charging when said accelerated-write operation is a low-to-high transition, said cell voltage discharging when said accelerated-write operation is a high-to-low transition.

15. The system of claim 14 wherein a sense amplifier is enabled to amplify said bitline voltage levels for said bitline and said corresponding bitline bar.

16. The system of claim 15 wherein said bitline voltage levels for said bitline and said bitline bar reach respective full-state bitline levels.

17. The system of claim 16 wherein said cell voltage reaches a full-state cell voltage level to successfully complete said state-change transition during said high-speed memory cycle.

18. The system of claim 17 wherein said DRAM controller de-activates said wordline to store said full-state cell voltage level as a corresponding write-data value in said memory cell.

19. The system of claim 18 wherein said DRAM controller de-activates said wordline only after said cell voltage reaches said full-state cell voltage level to successfully complete said state-change transition during said high-speed memory cycle, said cell voltage reaching said full-state cell voltage level before said wordline is de-activated because of said accelerated bitline split/amplification procedure.

20. The system of claim 19 wherein said sense amplifier equalizes said bitline voltage levels for said bitline and said bitline bar to prepare said memory cell for another high-speed memory cycle.

21. A method for implementing a high-speed memory device, comprising the steps of:
providing a memory cell that includes a bitline for transferring storage data, a wordline for enabling an accelerated-write operation in said memory cell, and a data storage node having a cell voltage; and
utilizing an accelerated-write circuit for directly providing said storage data to said bitline in a pre-toggled state in response to one or more accelerated-write enable signals, said cell voltage beginning a state-change transition towards said pre-toggled state immediately after said wordline is activated, said cell voltage reaching a full-state level before said wordline is deactivated during a high-speed memory cycle.

22. The method of claim 21 wherein said high-speed memory device is implemented to include a high-speed dynamic random-access memory device configured to perform said accelerated-write operation.

23. The method of claim 22 wherein said high-speed memory cycle of said high-speed dynamic random-access memory device is less than an approximate 8-nanosecond cycle duration time.

24. The method of claim 22 wherein said high-speed dynamic random-access memory device includes a plurality of DRAM cells, a series of bitline signals and corresponding bitline bar signals, a series of wordlines, and a series of accelerated-write sense amplifiers, each of said plurality of DRAM cells being coupled to one of said series of wordlines, each of said plurality of DRAM cells being coupled to either one of said series of bitline signals or one of said series of bitline bar signals, each of said series of accelerated-write sense amplifiers being coupled to a bitline pair that includes one of said series of bitline signals and a corresponding one of said series of bitline bar signals.

25. The method of claim 21 wherein said memory cell is implemented to include a cell capacitor device configured to store said cell voltage, and an FET device controlled by said wordline, said FET device coupling said cell capacitor to said bitline when said wordline is activated, said FET device decoupling said cell capacitor from said bitline when said wordline is deactivated, said FET device having relatively high resistance characteristics that cause said state-change transition to require a finite transition time to complete, said finite transition time limiting cycle time reductions in said high-speed memory cycle.

26. The method of claim 21 wherein said accelerated-write circuit is implemented as part of an accelerated-write sense amplifier that also includes a non-disturb read section for performing a non-disturb read operation to read data directly from said bitline to an output section of said high-speed memory device, a sense amplification section configured to perform a differential amplification procedure upon said bitline and a corresponding bitline bar signal, and an equalization section configured to perform a bitline equalization procedure to equalize voltage levels between said bitline and said bitline bar signal.

27. The method of claim 21 wherein a DRAM controller provides said one or more accelerated-write enable signals to said accelerated-write circuit to thereby enable said accelerated-write operation, said accelerated-write circuit then performing a direct bitline-data transfer procedure to immediately transfer data values present on an LIO line or an LIOb line into said memory device directly onto said bitline and a corresponding bitline bar.

28. The method of claim 27 wherein said accelerated-write enable signals include a CSELW signal and a CSELWb signal, said accelerated write-enable signals turning on a bitline bar switch device and bitline switch device to pass said data values from said LIO line and said LIOb line onto said bitline and said bitline bar.

29. The method of claim 28 wherein, when said LIO line is in a low state with said LIOb line remaining high, and said CSELW signal and said CSELWb signal are active, then an input low value from said LIO line is passed to a bitline bar FET device through said bitline bar switch device, said bitline bar FET device responsively pulling said bitline bar to a output high value, said input low value from said LIO line also being inverted and passed to a bitline FET device through a bitline inverter, said bitline FET device then pulling said bitline to a output low value.

30. The method of claim 28 wherein, when said LIOb line is in a low state with said LIO line remaining high, and said CSELW signal and said CSELWb signal are active, then an input low value from said LIOb line is passed to a bitline FET device through said bitline switch device, said bitline FET device responsively pulling said bitline to a high value, said input low value from said LIOb line also being inverted and passed to a bitline bar FET device through an inverter, said bitline bar FET device then pulling said bitline bar to a low output value.

31. The method of claim 21 wherein a DRAM controller activates a wordline of said memory cell to thereby couple said bitline to said cell voltage in said data storage node for initiating said accelerated-write operation.

32. The method of claim 31 wherein an accelerated bitline split/amplification procedure causes said bitline voltage levels for said bitline and a corresponding bitline bar to begin to diverge in opposite directions immediately after said wordline is activated.

33. The method of claim 32 wherein said bitline and said bitline bar begin to diverge towards pre-toggled states that correspond to final state levels of said accelerated-write operation.

34. The method of claim 33 wherein said cell voltage beings said state-change transition immediately after said accelerated bitline split/amplification procedure starts, said cell voltage charging when said accelerated-write operation is a low-to-high transition, said cell voltage discharging when said accelerated-write operation is a high-to-low transition.

35. The method of claim 34 wherein a sense amplifier is enabled to amplify said bitline voltage levels for said bitline and said corresponding bitline bar.

36. The method of claim 35 wherein said bitline voltage levels for said bitline and said bitline bar reach respective full-state bitline levels.

37. The method of claim 36 wherein said cell voltage reaches a full-state cell voltage level to successfully complete said state-change transition during said high-speed memory cycle.

38. The method of claim 37 wherein said DRAM controller de-activates said wordline to store said full-state cell voltage level as a corresponding write-data value in said memory cell.

39. The method of claim 38 wherein said DRAM controller de-activates said wordline only after said cell voltage reaches said full-state cell voltage level to successfully complete said state-change transition during said high-speed memory cycle, said cell voltage reaching said full-state cell voltage level before said wordline is de-activated because of said accelerated bitline split/amplification procedure.

40. The method of claim 39 wherein said sense amplifier equalizes said bitline voltage levels for said bitline and said bitline bar to prepare said memory cell for another high-speed memory cycle.

41. A system for implementing a high-speed memory device, comprising:
means for implementing a bitline for transferring storage data, a wordline for enabling an accelerated-write operation in said means for implementing, and a data storage node having a cell voltage; and
means for directly providing said storage data to said bitline in a pre-toggled state in response to one or more accelerated-write enable signals, said cell voltage beginning a state-change transition towards said pre-toggled state immediately after said wordline is activated, said cell voltage reaching a full-state level before said wordline is deactivated during a high-speed memory cycle.

* * * * *